(12) United States Patent
Takizawa

(10) Patent No.: US 7,279,257 B2
(45) Date of Patent: Oct. 9, 2007

(54) PATTERN FORMING METHOD, METHOD OF MANUFACTURING THIN FILM TRANSISTOR SUBSTRATE, METHOD OF MANUFACTURING LIQUID CRYSTAL DISPLAY AND EXPOSURE MASK

(75) Inventor: Hideaki Takizawa, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 540 days.

(21) Appl. No.: 10/768,998

(22) Filed: Jan. 30, 2004

(65) Prior Publication Data

US 2004/0229410 A1    Nov. 18, 2004

(51) Int. Cl.
*G02F 7/20* (2006.01)
(52) U.S. Cl. .................. 430/22; 430/30; 430/318; 430/319; 430/321; 430/394
(58) Field of Classification Search ............... None
See application file for complete search history.

(56) References Cited

U.S. PATENT DOCUMENTS

| | | | |
|---|---|---|---|
| 5,026,143 A * | 6/1991 | Tanaka et al. ............... | 349/143 |
| 6,356,320 B1 * | 3/2002 | Chung et al. ................. | 349/54 |
| 2002/0039841 A1 * | 4/2002 | Takizawa .................... | 438/708 |

FOREIGN PATENT DOCUMENTS

| JP | 62-105146 | 5/1987 |
|---|---|---|
| JP | 2-143513 | 6/1990 |
| JP | 6-324474 | 11/1994 |
| JP | WO 95/16276 | 6/1995 |
| JP | 9-236930 | 9/1997 |
| JP | 9-298155 | 11/1997 |
| JP | 11-174402 | 7/1999 |

* cited by examiner

*Primary Examiner*—John A. McPherson
(74) *Attorney, Agent, or Firm*—Greer, Burns & Crain, Ltd.

(57) ABSTRACT

The invention relates to a pattern forming method, a method of manufacturing a TFT substrate, a method of manufacturing a liquid crystal display and an exposure mask and provides a pattern forming method, a method of manufacturing a TFT substrate, a method of manufacturing a liquid crystal display and an exposure mask which make it possible to provide a liquid crystal display having high display characteristics. In a pattern forming method for forming a resist pattern extending across a first divided exposure region and a second divided exposure region among a plurality of divided exposure regions on a substrate, a resist film is formed on the substrate; the resist film in the first divided exposure region is exposed using an exposure mask to form a latent image which defines one edge of a resist pattern in the vicinity of a boundary between the first divided exposure region and the second divided exposure region; the resist film in the second divided exposure region is exposed using another exposure mask to form a latent image which defines another edge of the resist pattern in the vicinity of the boundary; and the resist film is developed to form the resist pattern.

16 Claims, 12 Drawing Sheets

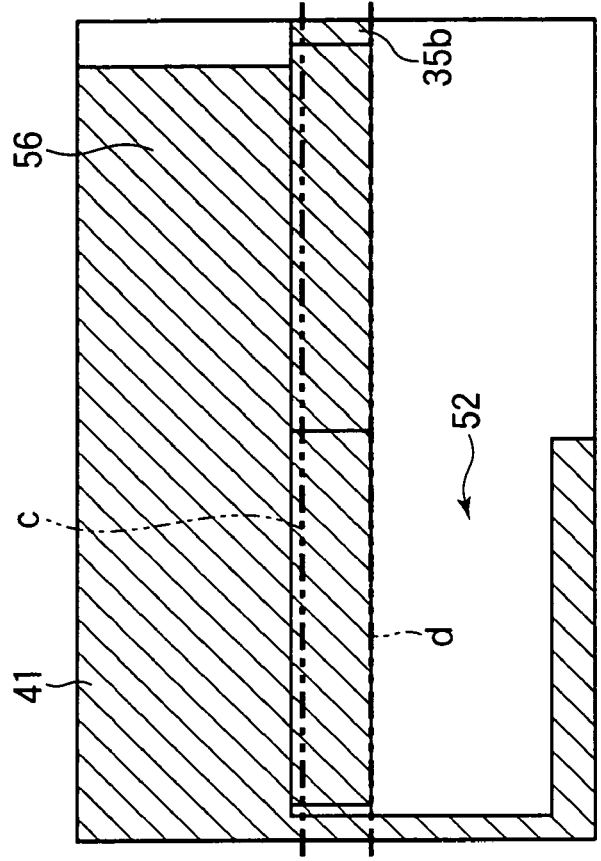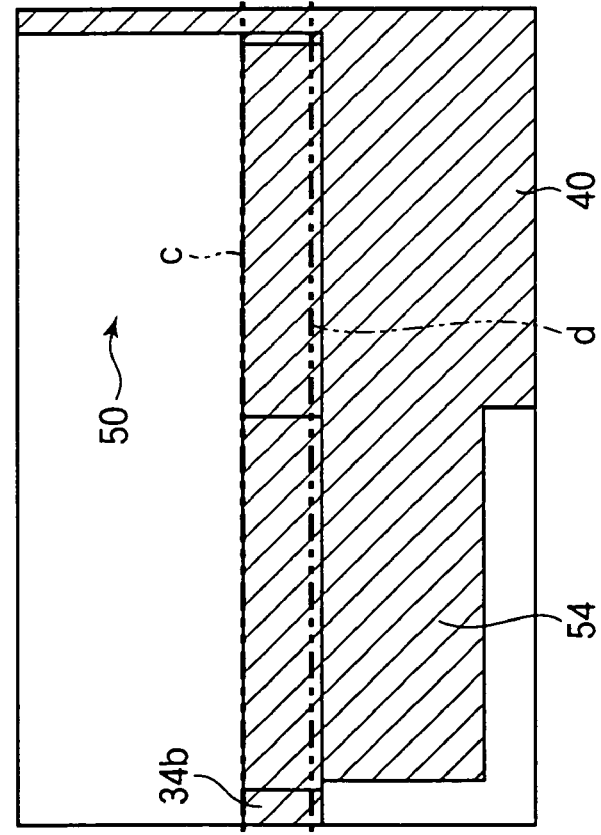

PATTERN FORMING METHOD, METHOD OF MANUFACTURING THIN FILM TRANSISTOR SUBSTRATE, METHOD OF MANUFACTURING LIQUID CRYSTAL DISPLAY AND EXPOSURE MASK

BACKGROUND OF THE INVENTION

1. Field of the Invention

The present invention relates to a pattern forming method for forming a resist pattern on a substrate having a plurality of divided exposure regions, a method of manufacturing a thin film transistor substrate, a method of manufacturing a liquid crystal display and an exposure mask.

2. Description of the Related Art

Active matrix color liquid crystal displays have been spreading as displays of personal computers and wall-mounted television receivers. An active matrix liquid crystal display has two substrates and a liquid crystal sealed between the substrates. Thin film transistors (TFTs) are formed like a matrix on one of the two substrates as switching elements for driving the liquid crystal at each pixel. Presently, technical studies and product developments are being actively made to promote the spread of liquid crystal displays having larger screens.

In order to manufacture active matrix displays at a lower cost, it is important to form TFT substrates with a smaller number of manufacturing steps and a high yield of manufacture. For this reason, photolithographic techniques have prevailed as the mainstream because of their capability of transferring a multiplicity of patterns at a time. One exposure mask (reticle) is normally used at one patterning step.

In the case of a liquid crystal display having a large screen, since a substrate is large-sized, it is difficult to transfer patterns on the entire substrate at a time because of the structure of an exposure apparatus. For this reason, divided exposure in which an entire area to be patterned on a substrate is divided into a plurality of regions to be exposed is carried out. Divided exposure employs a separate exposure mask for each of divided regions to be exposed. A resist film formed on a wiring layer is shielded from light in its regions other than divided exposure regions to be exposed, and each of the divided exposure regions is exposed using a predetermined exposure mask and is thereafter developed to form a resist pattern covering the entire regions.

In divided exposure, the exposure mask and the substrate are aligned with each other in each of divided exposure regions. Therefore, the exposure mask for each of divided exposure regions may be misaligned relative to the substrate, and the width of an overlap between a source electrode and a gate electrode of a TFT can therefore be different in each of the divided exposure regions. In this case, the TFT formed in each of divided exposure regions has a different parasitic capacitance Cgs between the gate electrode and the source electrode, which results in differences $\Delta V$ between pixel potentials of the divided exposure regions and hence differences $\Delta T$ in light transmittance between the regions. As a result, differences in luminance are produced on the display screen of the liquid crystal display and are visually perceived as display irregularities.

A method of making such display irregularities less visually perceptible is a pattern forming method in which patterns associated with different exposure masks are arranged such that they are mixed with each other in a part where the patterns are stitched (for example, see Patent Document 4). Each of the exposure masks is laid out such that in a region of the stitched part where exposure is performed twice or more, the pattern in each pixel is formed by one cycle of exposure and is shielded from light during other cycles of exposure.

Incidentally, the documents of the related art are as follows:

Patent Document 1: JP-A-62-105146
Patent Document 2: JP-A-2-143513
Patent Document 3: JP-A-6-324474
Patent Document 4: JP-A-9-236930
Patent Document 5: JP-A-9-298155
Patent Document 6: JP-A-11-174402
Patent Document 7: International Publication Brochure No. WO95/16276

According to the pattern forming method in the related art, in order to reduce differences in the overlap width of the source electrode and the gate electrode of a TFT between divided exposure regions, a relative misalignment (stitching error) of exposures must be made small in each of a source electrode forming layer and a gate electrode forming layer. For this purpose, parameters (X, Y and $\theta$ or the like) for positioning of an X-Y stage of an exposure apparatus are corrected based on a value read from a vernier transferred on to a glass substrate using a measuring reticle for adjusting the exposure apparatus.

The accuracy of alignment of an exposure mask used at a photolithographic step with a substrate can vary within accuracy specifications for the same. In aligning methods according to the related art, alignment between an exposure mask and a substrate is corrected on the basis of an average value of alignment errors of a plurality of exposure masks. Therefore, correction has not been necessarily effective for an exposure mask having an alignment error that is far from the average value. The condition of an exposure apparatus may not be constant, and a positioning error of the X-Y stage can change gradually. The positioning error of the X-Y stage can also undergo irregular changes because of changes in the environment such as the atmospheric pressure. Under such circumstances, the pattern forming method according to the related art results in a problem in that parameters for positioning the X-Y stage of the exposure apparatus cannot be sufficiently corrected.

SUMMARY OF THE INVENTION

It is an object of the invention to provide a method of manufacturing a liquid crystal display, a method of manufacturing a thin film transistor substrate, a pattern forming method and an exposure mask which make it possible to achieve high display characteristics.

The above object is achieved by a pattern forming method for forming a resist pattern on a substrate having a plurality of divided exposure regions, the resist pattern extending across a first divided exposure region and a second divided exposure region among the plurality of divided exposure regions, the method comprising the steps of forming a resist film on the substrate, exposing the resist film in the first divided exposure region to form a latent image which defines one edge of the resist pattern in the vicinity of a boundary between the first divided exposure region and the second divided exposure region, exposing the resist film in the second divided exposure region to form a latent image which defines another edge of the resist pattern in the vicinity of the boundary or one edge of another resist pattern located opposite to that edge, and developing the resist film to form the resist pattern.

BRIEF DESCRIPTION OF THE DRAWINGS

FIGS. 8A and 8B are enlarged views of the exposure masks M1 and M2 in the region α in FIG. 6;

DESCRIPTION OF THE PREFERRED EMBODIMENT

A description will now be made with reference to FIGS. 1 to 13 on a pattern forming method, a method of manufacturing a thin film transistor substrate, a method of manufacturing a liquid crystal display and exposure masks according to an embodiment of the invention. According to the pattern forming method of the present embodiment, latent images of two edges defining line widths of part of wirings are formed by different exposures on a resist film in the vicinity of a boundary between divided exposures (stitched exposures). As a result, the line widths of the wirings vary when there is a misalignment relative to the substrate at each exposure. For example, there is provided two adjoining wirings for which latent images are formed at respective edges thereof opposite to each other by the different cycles of divided exposure. The line width of either or both of the wirings is measured to obtain the direction and amount of a misalignment of one of the divided exposures relative to the other. Based on the direction and amount of the misalignment thus obtained, a correction value for the relative position of the substrate and the exposure mask for the next exposure can be determined to suppress any increase of the misalignment (stitching error).

Figure 1:
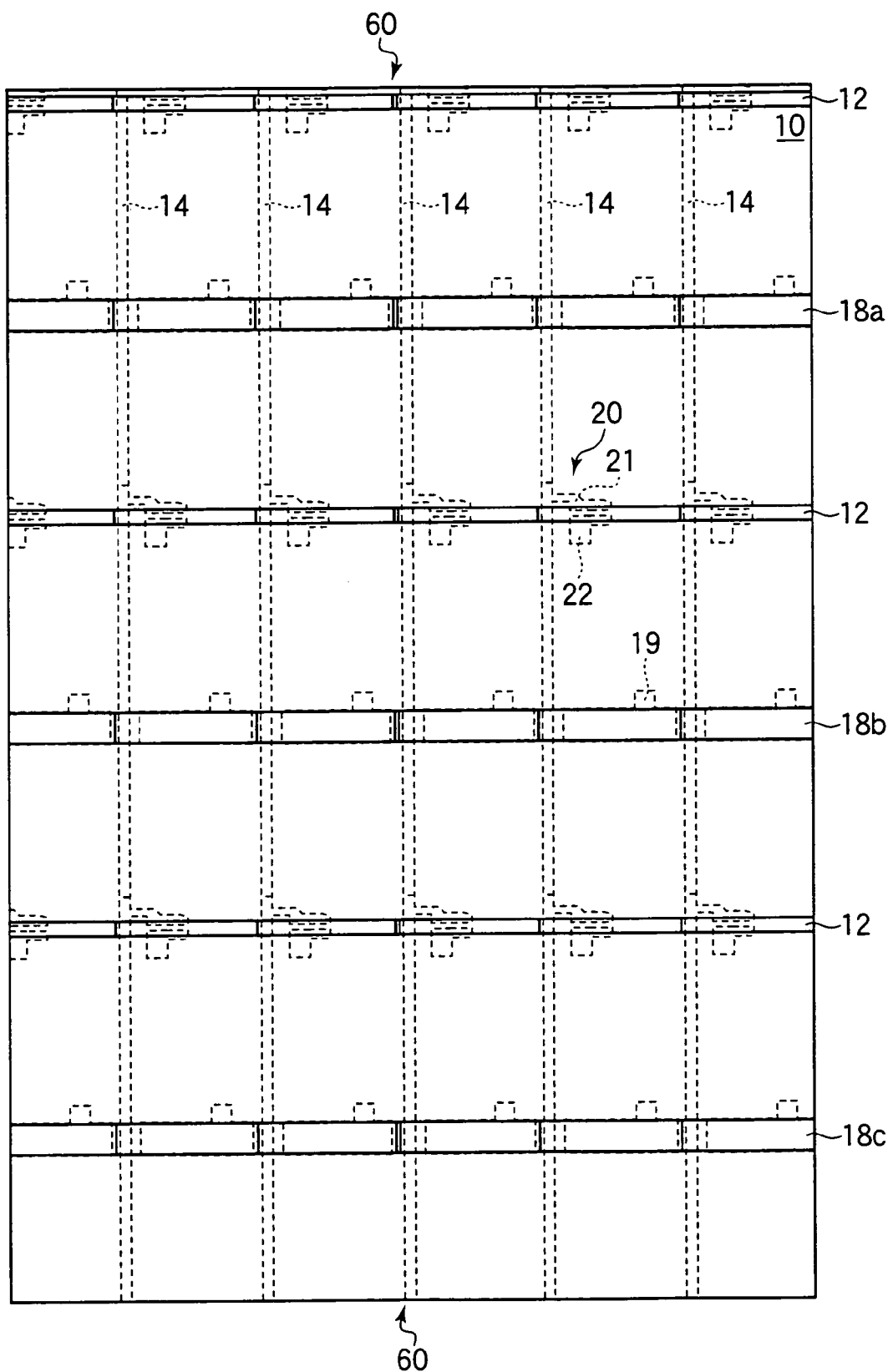
FIG. 1 shows a part of a glass substrate on which a gate metal layer has been patterned using stitched exposure.

A description will now be made on a general pattern forming method and exposure masks which are the basis of the present embodiment. FIG. 1 shows a part of a glass substrate on which a gate metal layer has been patterned by the use of divided exposures. FIG. 1 shows the neighborhood of a boundary between divided exposure regions. A case is illustrated in which gate metal layers on the right and left of a boundary 60 have been formed by different exposures, and no relative misalignment has occurred between the substrate and exposure masks at each exposure. Therefore, the boundary 60 is not visually perceptible after the gate metal layers are patterned. As shown in FIG. 1, a plurality of gate bus lines 12 extending in the horizontal direction are formed on a glass substrate 10 in parallel with each other (three lines are shown in FIG. 1). Storage capacitor bus lines 18a to 18c extending in parallel with the gate bus lines 12 are formed between respective pairs of adjoining gate bus lines 12 (three lines are shown in FIG. 1.

The broken lines in the figure indicate patterned drain metal layers which are formed at a subsequent step. At the subsequent step, a plurality of drain bus lines 14 is formed which intersect with the gate bus lines 12 and the storage capacitor bus lines 18a to 18c with an insulation film interposed between them. TFTs 20 are formed in the vicinity of the intersections between the gate bus lines 12 and the drain bus lines 14. A drain electrode 21 of a TFT 20 is electrically connected to a drain bus line 14, and a source electrode 22 of the same is electrically connected to a pixel electrode (not shown) which is formed at a still later step. A part of a gate bus line 12 serves as a gate electrode of a TFT 20.

Figure 2:
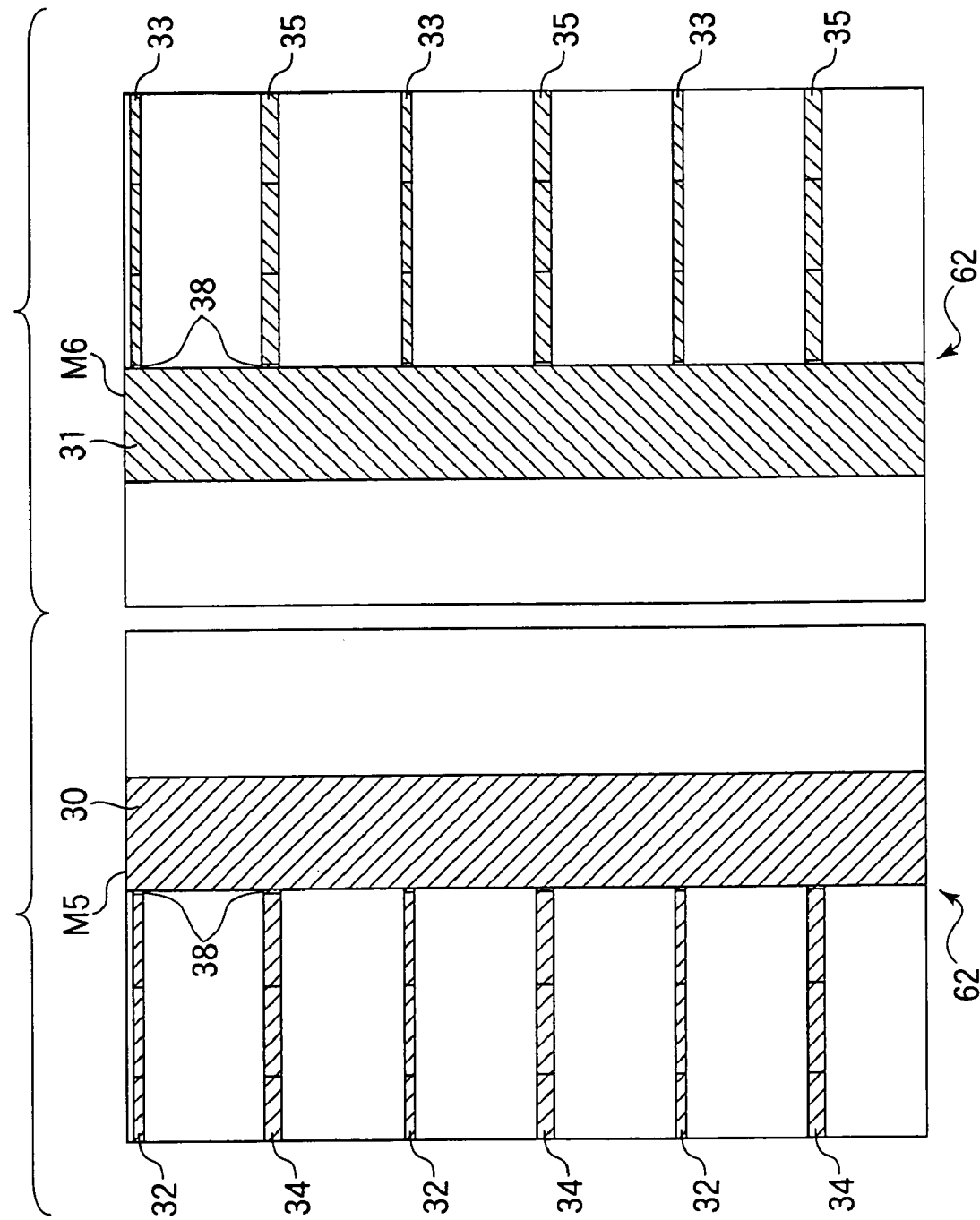
FIGS. 2A and 2B show exposure masks M5 and M6.
Figure 3:
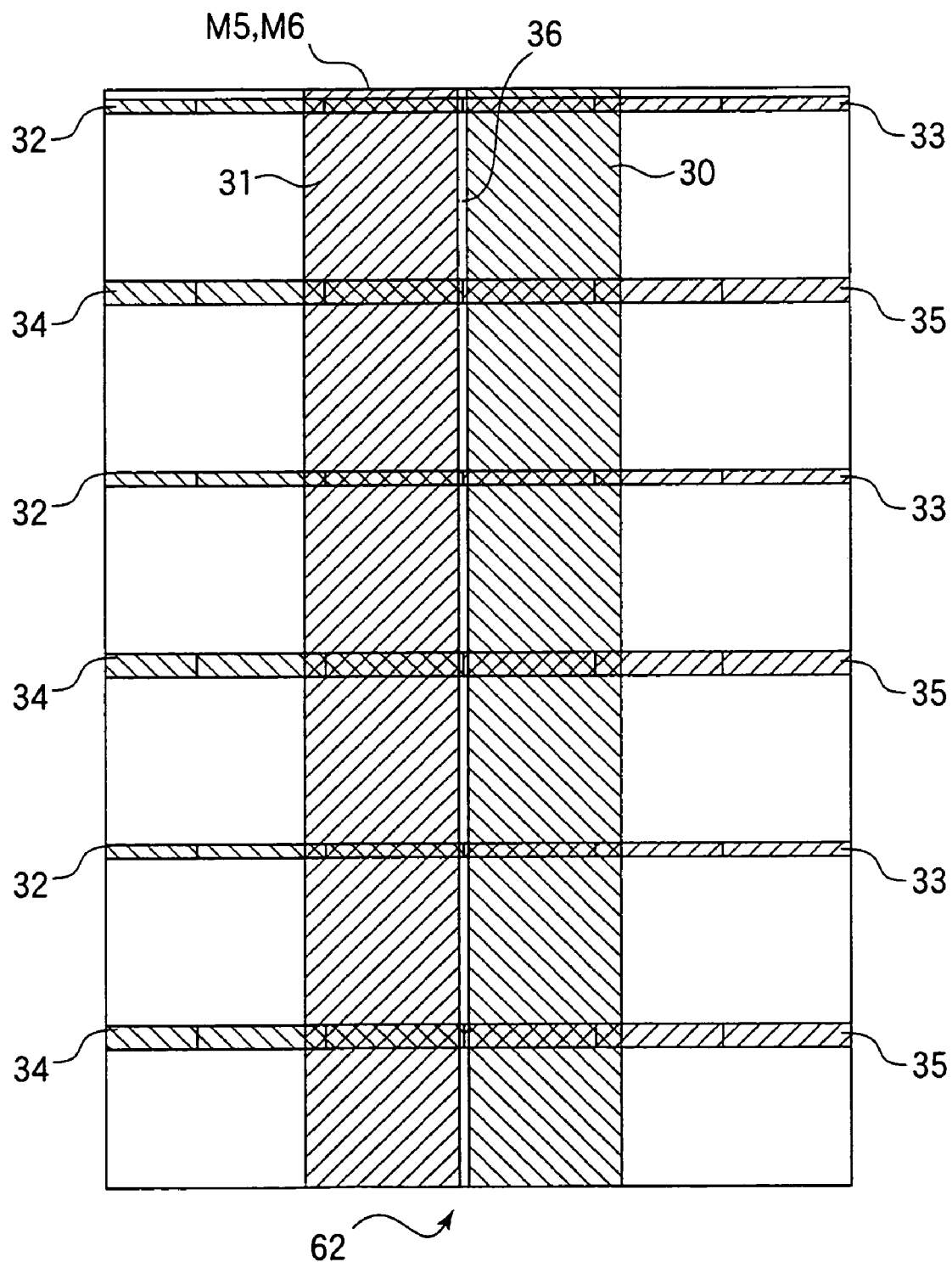
FIG. 3 shows a state of the exposure masks M5 and M6 overlapping each other.
Figure 4:
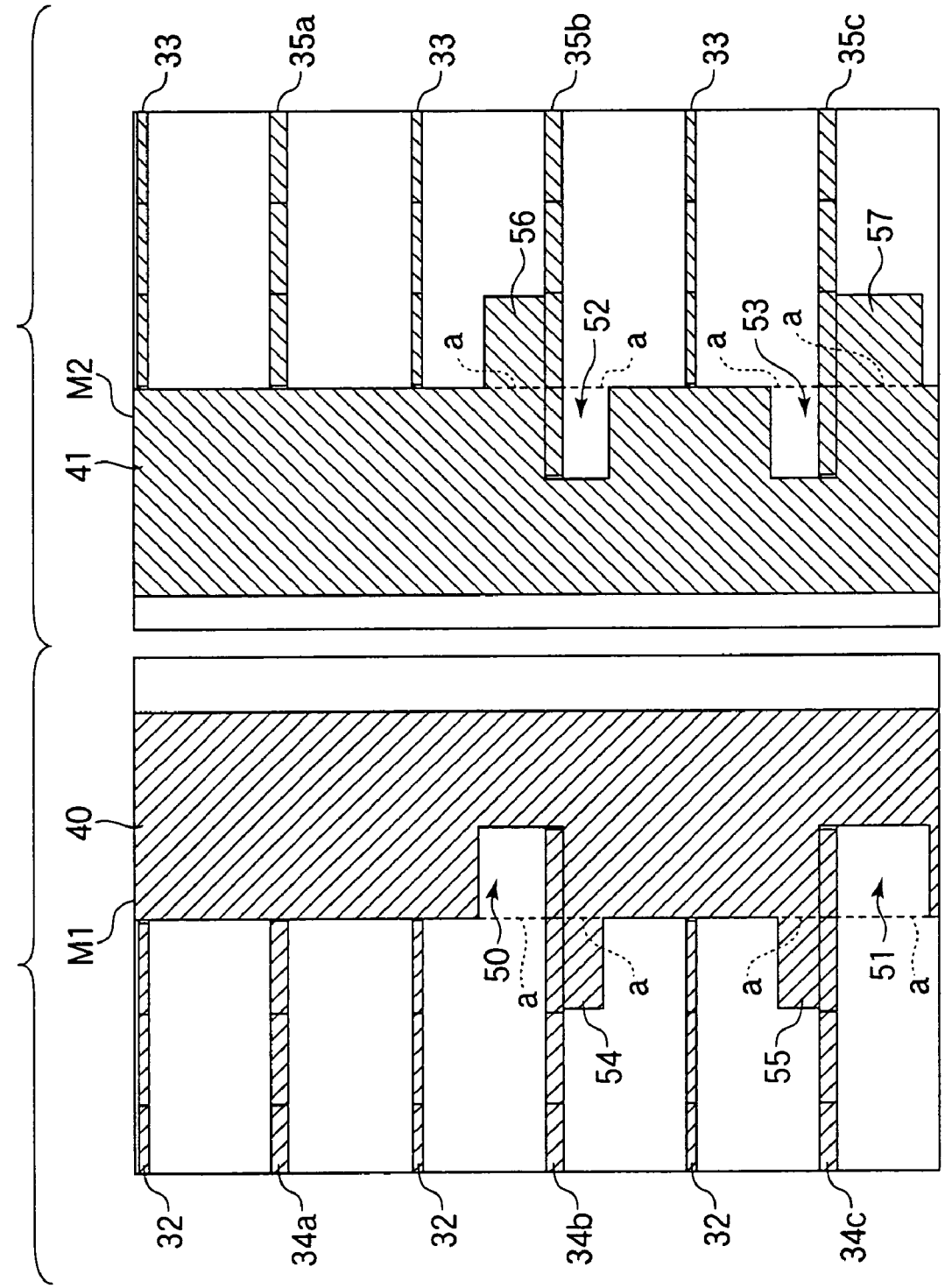
FIGS. 4A and 4B show exposure masks M1 and M2 in an embodiment of the invention.

FIG. 2A shows an exposure mask M5 used for patterning a gate metal layer in a region on the left of the boundary among the regions shown in FIG. 1. FIG. 2B shows an exposure mask M6 used for patterning a gate metal layer in a region on the right of the boundary among the regions shown in FIG. 1. FIG. 3 shows a state of the exposure masks M5 and M6 shown in FIGS. 2A and 2B overlapping each other. As shown in FIGS. 2A to 3, the exposure mask M5 has a shielding band 30 which extends in the vertical direction in the figures and which serves as a light shield for a region outside (on the right of) a stitching portion 62 associated with the boundary 60 and wiring patterns 32 and 34 which are writing patterns extending from the shielding band 30 to the left in parallel with each other. The exposure mask M6 has a shielding band 31 which extends in the vertical direction in the figures and which serves as a light shield for a region outside (on the left of) a stitching portion 62 and wiring patterns 33 and 35 which are writing patterns extending from the shielding band 31 to the right in parallel with each other. The wiring patterns 32 and 33 are writing patterns for forming resist patterns on regions to become the gate bus lines 12 in the respective divided exposure regions. The wiring patterns 34 and 35 are writing patterns for forming resist patterns on regions to become the storage capacitor bus lines 18a to 18c in the respective divided exposure regions.

For such divided exposure, an overlap region 36 which transmits light is provided at the stitching portions 62 of the exposure masks M5 and M6 such that an unexposed part which can cause shorting between the gate bus lines 12 and the storage capacitor bus lines 18a to 18c will not be formed along the boundary 60 even if, for example, there is a leftward or rightward relative misalignment between the exposure masks M5 and M6 with respect to the substrate, the misalignment being within control accuracy of the exposure apparatus (see FIG. 3). The overlap region 36 is provided so as to extend in the vertical direction in the figure. In order to prevent breakage of the gate bus lines 12 and the storage capacitor bus lines 18a to 18c attributable to the overlap region 36 provided at the exposure masks M5 and M6, auxiliary patterns 38 are embedded between the wiring patterns 32, 34 and the shielding band 30 of the exposure mask M5 and between the wiring patterns 33, 35 and the shielding band 31 of the exposure mask M6. When divided exposure is performed using the exposure masks M5 and M6, ambient light is blocked by a blind mechanism provided in the exposure apparatus to form the boundary 60 and the region on the left of the same by an exposure using the exposure mask M5 and to form the boundary 60 and the region on the right of the same by an exposure using the exposure mask M6. The boundary 60 corresponding to the stitched portions 62 is formed by an exposure using both of the exposure masks M5 and M6, and it has a width of a few μm when viewed in a direction perpendicular to the substrate surface. In the present specification, however, the boundary 60 and the stitching portions 62 may sometimes be regarded as straight lines having no width for convenience in the following description.

Figure 5:
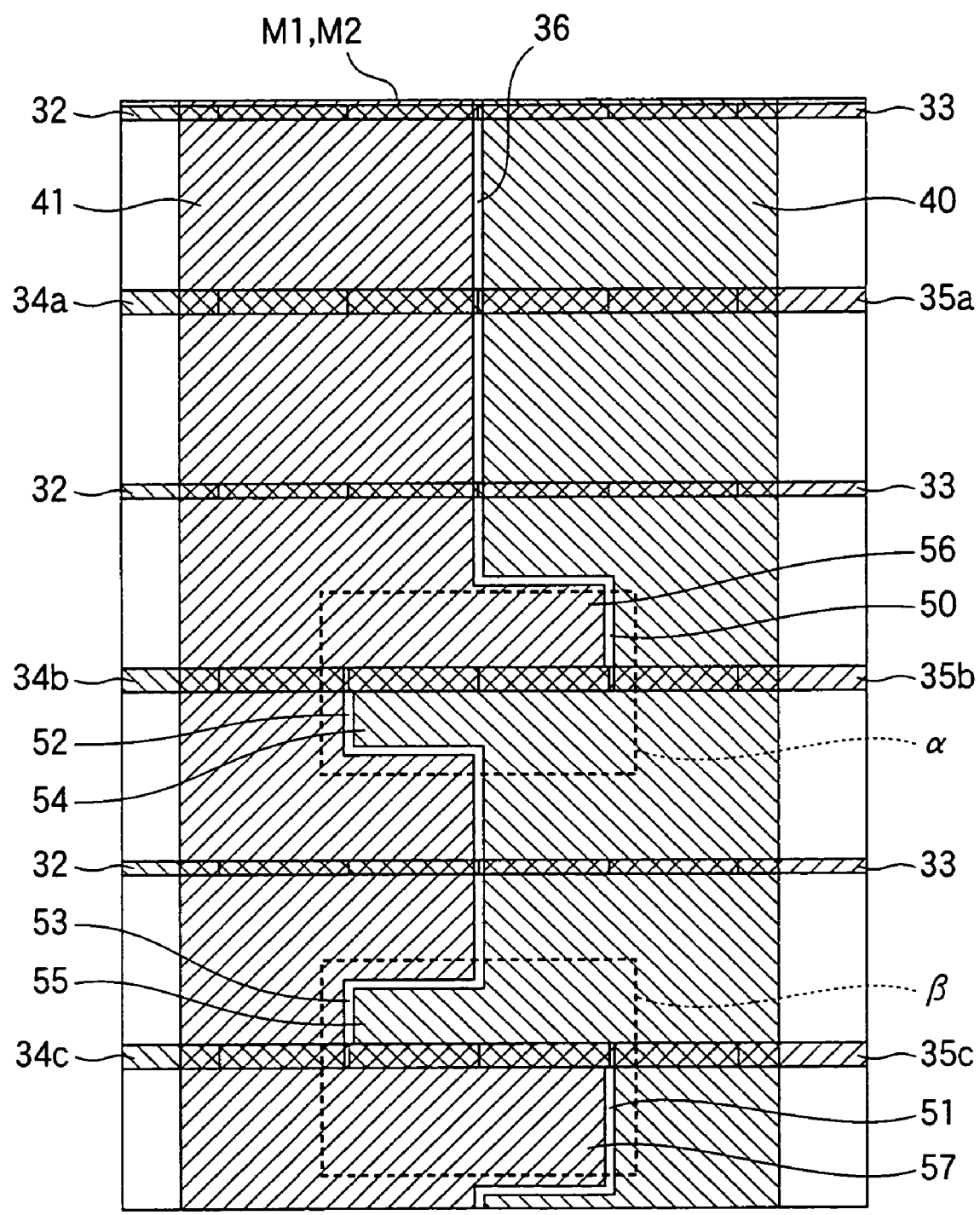
FIG. 5 shows a state of the exposure masks M1 and M2 overlapping each other in the embodiment of the invention.

Exposure masks of the present embodiment will now be described. FIG. 4A shows the neighborhood of a stitching portion of an exposure mask M1 which is used for patterning a gate metal layer in a region on the left of a boundary among regions corresponding to those shown in FIG. 1. FIG. 4B shows the neighborhood of a stitching portion of an exposure mask M2 which is used for patterning a gate metal layer in a region on the right of the boundary among the regions corresponding to those shown in FIG. 1. FIG. 5 shows a state of the exposure masks M1 and M2 (a pair of exposure masks) as shown in FIG. 4A and FIG. 4B overlapping each other. In the present embodiment, a positive resist which is solubilized when exposed to light is applied to form a resist layer on the gate metal layers which are wiring layers (layers to be patterned) formed throughout the substrate.

As shown in FIG. 4A, the exposure mask M1 has a cutout 50 that is a rectangular cut-out in a shielding band 40 extending along an upper edge of a wiring pattern 34b such that a latent image can be formed on the resist film, the latent image being located on the right of an imaginary line a corresponding to the stitching portion 62 shown in FIGS. 2A and 3 and defining an upper edge of the storage capacitor bus line 18b in FIG. 1. For example, the cutout 50 is equivalent to one pixel in length. The exposure mask M1 has a protrusion 54 that is a rectangular protrusion from the shielding band 40 extending along a lower edge of the wiring pattern 34b such that a latent image located on the left of the imaginary line a and defining a lower edge of the storage capacitor bus line 18b will not be formed in a part of the resist film. For example, the protrusion 54 is equivalent to one pixel in length.

On the contrary, in the vicinity of a wiring pattern 34c located below the wiring pattern 34b, the exposure mask M1 has a cutout 51 that is a rectangular cut-out in the shielding band 40 extending along a lower edge of the wiring pattern 34c such that a latent image located on the right of the imaginary line a and defining a lower edge of the storage capacitor bus line 18c in FIG. 1 can be formed on the resist film. For example, the cutout 51 is equivalent to one pixel in length. The exposure mask M1 also has a protrusion 55 that is a rectangular protrusion from the shielding band 40 extending along an upper edge of the wiring pattern 34c such that a latent image located on the left of the imaginary line a and defining an upper edge of the storage capacitor bus line 18c will not be formed in a part of the resist film. For example, the protrusion 55 is equivalent to one pixel in length.

As shown in FIGS. 4B and 5, the exposure mask M2 has a protrusion 56 that is a rectangular protrusion from a shielding band 41 extending along an upper edge of a wiring pattern 35b such that a latent image located on the right of an imaginary line a and defining an upper edge of the storage capacitor bus line 18c will not be formed in a part of the resist film. The protrusion 56 has substantially the same length as the cutout 50 in the exposure mask M1. The exposure mask M2 has a cutout 52 that is a rectangular cut-out in the shielding band 41 extending along a lower edge of the wiring pattern 35b such that a latent image located on the left of the imaginary line a and defining a lower edge of the storage capacitor bus line 18b can be formed on the resist film. The cutout 52 has substantially the same length as the protrusion 54 of the exposure mask M1.

In the vicinity of a wiring pattern 35c located below the wiring pattern 35b, the exposure mask M2 has a cutout 53 that is a rectangular cutout in the shielding band 41 extending along an upper edge of the wiring pattern 35c such that a latent image located on the left of the imaginary line a and defining an upper edge of the storage capacitor bus line 18c can be formed on the resist film. The cutout 53 has substantially the same length as the protrusion 55 of the exposure mask M1. The exposure mask M2 also has a protrusion 57 that is a rectangular protrusion from the shielding band 41 extending along a lower edge of the wiring pattern 35c such that a latent image located on the right of the imaginary line a and defining a lower edge of the storage capacitor bus line 18c will not be formed in a part of the resist film. The protrusion 57 has substantially the same length as the cutout 51 in the exposure mask M1.

Thus, the exposure mask M2 has the protrusions 56 and 57 and the cutouts 52 and 53 which are in a complementary relationship with the cutouts 50 and 51 and the protrusions 54 and 55 of the exposure mask M1, respectively.

A description will now be made on a pattern forming method, a method of manufacturing a thin film transistor substrate, and a method of manufacturing a liquid crystal display according to the present embodiment. First, a gate metal layer that is a wiring layer is formed throughout a glass substrate 10. Next, a positive resist is applied on to the gate metal layer to form a resist film. Exposure is then performed using the exposure masks M1 and M2 of the present embodiment to form predetermined latent images on the resist film. The resist film having latent images formed thereon is developed to dissolve exposed parts to form a resist pattern. Then, the gate metal layer is etched using the resist pattern as an etching mask to form gate bus lines 12 and storage capacitor bus lines 18a to 18c.

Referring to the storage capacitor bus line 18b that is located in a region corresponding to a region α shown in FIG. 5, an upper edge of the same is defined by an exposure using the exposure mask M1, and a lower edge of the same is defined by an exposure using the exposure mask M2. Referring to the storage capacitor bus line 18c that is located in a region corresponding to a region β shown in FIG. 5, an upper edge of the same is defined by an exposure using the exposure mask M2, and a lower edge of the same is defined by an exposure using the exposure mask M1.

When there is no relative misalignment in the vertical direction between the exposure masks M1 and M2 with respect to the substrate, the storage capacitor bus line 18b in the region corresponding to the region α and the storage capacitor bus line 18c in the region corresponding to the region β are formed with a line width equal to that of storage capacitor bus lines 18b and 18c in other regions and a storage capacitor bus line 18a.

Figure 6:
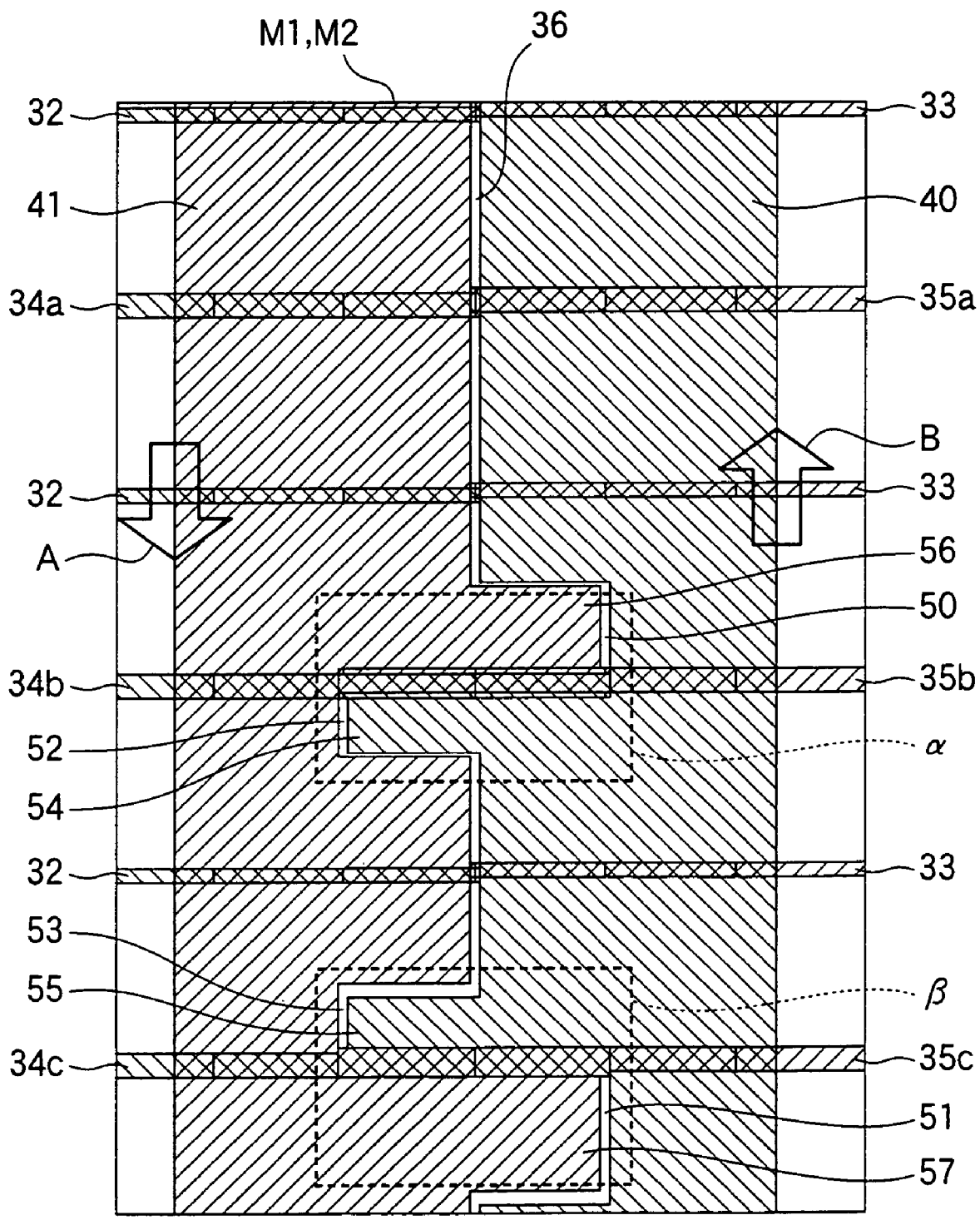
FIG. 6 shows a state of the exposure masks M1 and M2 overlapping each other in which the exposure mask M2 is misaligned upward relative to the exposure mask M1.
Figure 7:
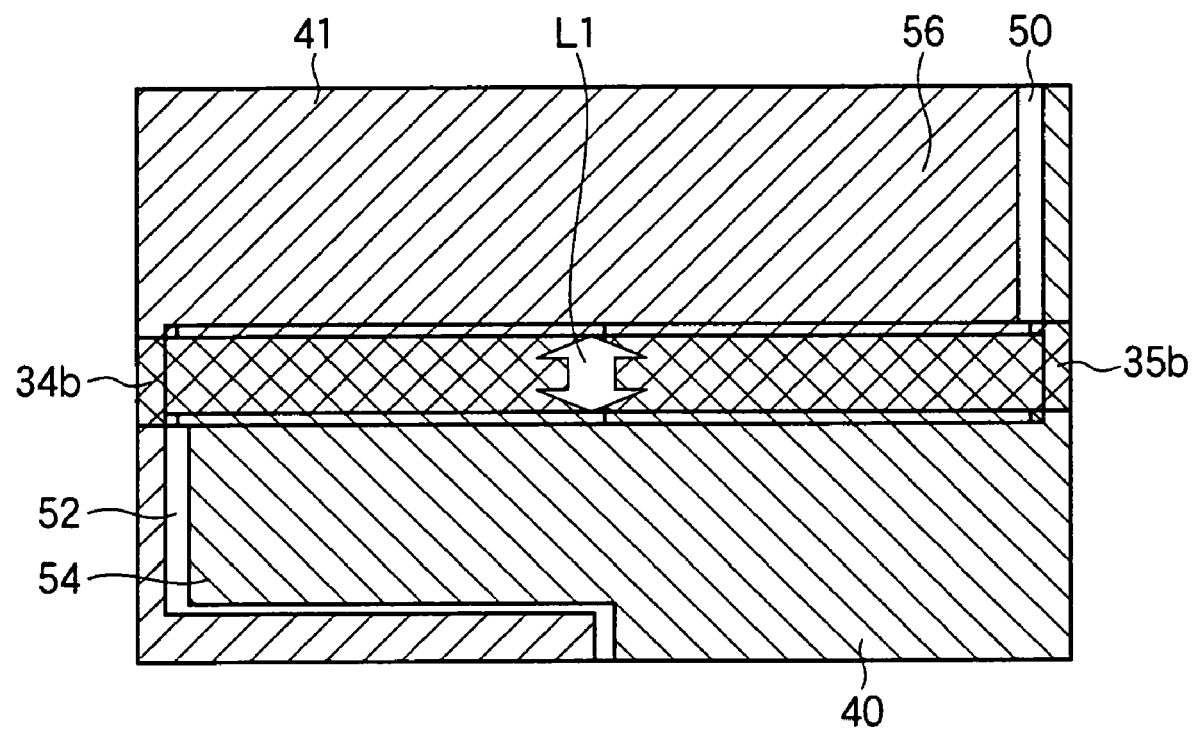
FIG. 7 is an enlarged view of a region α in FIG. 6.

FIG. 6 shows a state of the exposure masks M1 and M2 overlapping each other in which the exposure mask M2 is misaligned upward relative to the exposure mask M1 on the basis of the substrate. The arrow A on the left-hand side of the figure indicates the direction (downward direction) of a misalignment of the exposure mask M1 relative to the exposure mask M2 on the basis of the substrate. The arrow B on the right-hand side indicates the direction (upward direction) of a misalignment of the exposure mask M2 relative to the exposure mask M1 on the basis of the substrate. FIG. 7 is an enlarged view of the region α in FIG. 6. FIG. 8A is an enlarged view of only the exposure mask M1 in the region α, and FIG. 8B is an enlarged view of only the exposure mask M2 in the region α. In FIGS. 8A and 8B, the two-dot chain line c represents the position of an upper edge of a wiring pattern 34b formed in the region α, and the two-dot chain line d represents the position of a lower edge of a wiring pattern 35b formed in the region α.

Since an upward misalignment of the exposure mask M2 relative to the exposure mask M1 has occurred with respect to the substrate, as indicated by the thick arrow in FIG. 7 and the two-dot chain lines in FIGS. 8A and 8B, there is a small distance L1 (indicated by the thick arrow in FIG. 7) between the upper edge of the wiring pattern 34b that defines the upper edge of the storage capacitor bus line 18b in the region corresponding to the region α and the lower edge of the wiring pattern 35b that defines the lower edge of the storage capacitor bus line 18b in the same region. As a result, the line width of the storage capacitor bus line 18b formed in the region corresponding to the region α on the substrate is smaller than the line width of storage capacitor bus lines 18b in other regions and storage capacitor bus lines 18a.

Figure 9:
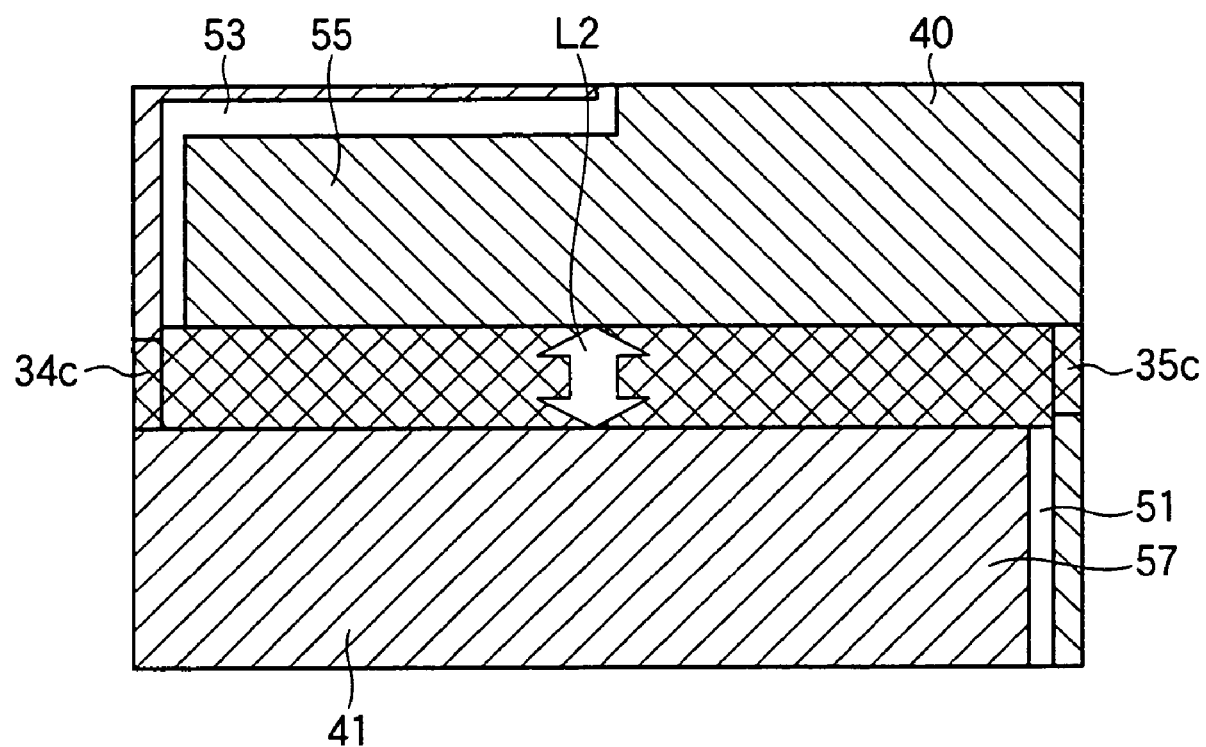
FIG. 9 is an enlarged view of a region β in FIG. 6.

FIG. 9 is an enlarged view of the region β in FIG. 6. Since an upward misalignment of the exposure mask M1 relative to the exposure mask M1 has occurred with respect to the substrate as shown in FIGS. 6 and 9, there is a great distance L2 (indicated by the thick arrow in FIG. 9) between an upper edge of a wiring pattern 35c that defines the upper edge of the storage capacitor bus line 18c in the region corresponding to the region β and a lower edge of a wiring pattern 34c that defines the lower edge of the storage capacitor bus line 18c in the same region. As a result, the line width of the storage capacitor bus line 18c formed in the region corresponding to the region β on the substrate is greater than the line width of storage capacitor bus lines 18c in other regions and the storage capacitor bus lines 18a.

Figure 10:
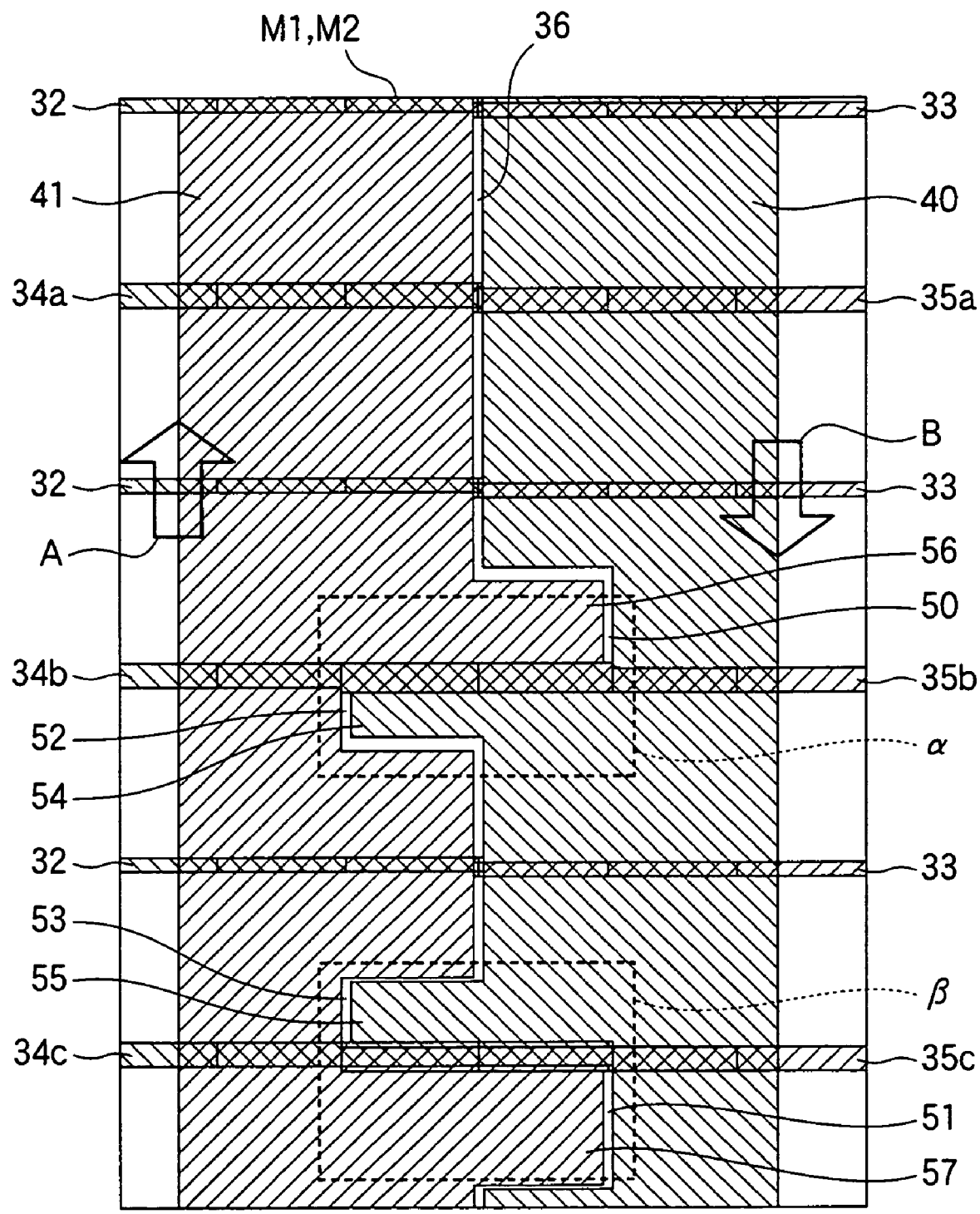
FIG. 10 shows a state of the exposure masks M1 and M2 overlapping each other in which the exposure mask M2 is misaligned downward relative to the exposure mask M1.
Figure 11:
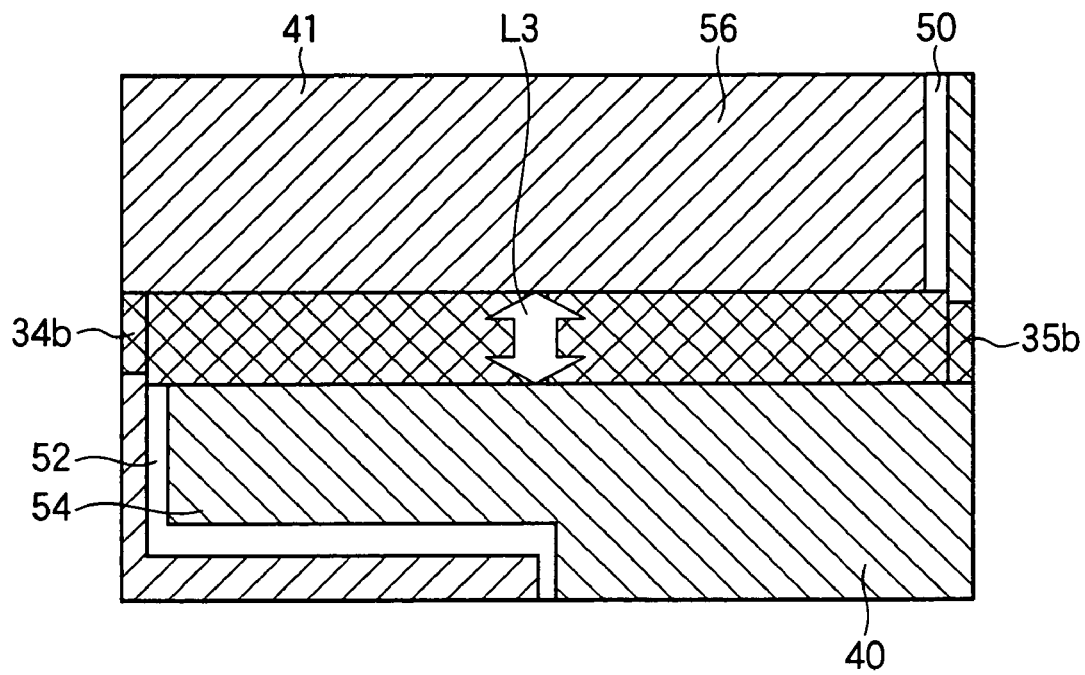
FIG. 11 is an enlarged view of a region α in FIG. 10.
Figure 12:
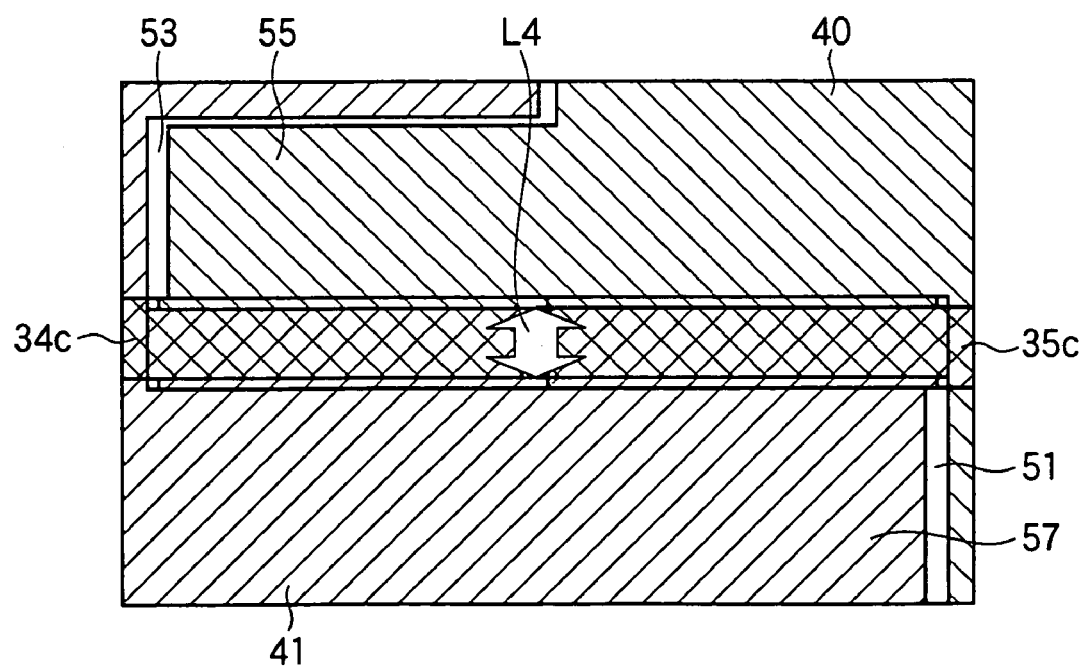
FIG. 12 is an enlarged view of a region β in FIG. 10.

FIG. 10 shows a state of the exposure masks M1 and M2 overlapping each other in which the exposure mask M2 is misaligned downward relative to the exposure mask M1 as opposed to the state shown in FIG. 6, on the basis of the substrate. The arrow A on the left-hand side of the figure indicates the direction (upward direction) of a misalignment of the exposure mask M1 relative to the exposure mask M2 on the basis of the substrate. The arrow B on the right-hand side indicates the direction (downward direction) of a misalignment of the exposure mask M2 relative to the exposure mask M1, on the basis of the substrate. FIG. 11 is an enlarged view of the region α in FIG. 10. FIG. 12 is an enlarged view of the region β in FIG. 10.

Since a downward misalignment of the exposure mask M2 relative to the exposure mask M1 has occurred with respect to the substrate as shown in FIGS. 10 and 11, there is a great distance L3 (indicated by the thick arrow in FIG. 11) between the upper edge of the wiring pattern 34b that defines the upper edge of the storage capacitor bus line 18b in the region corresponding to the region α and the lower edge of the wiring pattern 35b that defines the lower edge of the storage capacitor bus line 18b in the same region. As a result, the line width of the storage capacitor bus line 18b formed in the region corresponding to the region α on the substrate is greater than the line width of the storage capacitor bus lines 18b in other regions and the storage capacitor bus lines 18a.

On the contrary, since a downward misalignment of the exposure mask M2 relative to the exposure mask M1 has occurred with respect to the substrate as shown in FIGS. 10 and 12, there is a small distance L4 (indicated by the thick arrow in FIG. 12) between the upper edge of the wiring pattern 35c that defines the upper edge of the storage capacitor bus line 18c in the region corresponding to the region β and the lower edge of the wiring pattern 34c that defines the lower edge of the storage capacitor bus line 18c in the same region. As a result, the line width of the storage capacitor bus line 18c formed in the region corresponding to the region β on the substrate is smaller than the line width of the storage capacitor bus lines 18c in other regions and the storage capacitor bus lines 18a.

Thus, after the gate metal layer is patterned, the line widths of the storage capacitor bus line 18b in the region α and the storage capacitor bus line 18c in the region β are measured. Next, the line widths of the storage capacitor bus lines 18b and 18c are compared, and the direction of a relative misalignment between the exposure masks M1 and M2 can be identified from the widths. In the above-described example, when the line width of the storage capacitor bus line 18b is greater as shown in FIGS. 10 and 12, it indicates that the exposure mask M2 is misaligned downward relative to the exposure mask M1 with respect to the substrate. When the line width of the storage capacitor bus line 18c is greater as shown in FIGS. 6 and 9, it indicates that the exposure mask M2 is misaligned upward relative to the exposure mask M1 with respect to the substrate. Further, measured values and design values of the line widths of the storage capacitor bus line 18b in the region α and the storage capacitor bus line 18c in the region β may be compared to obtain the amount of a relative misalignment between the exposure masks M1 and M2 on the basis of the substrate. A correction value for the relative position of the substrate and the exposure masks M1 and M2 at the next exposure may be determined based on the direction and amount of misalignment to suppress any relative alignment error (stitching error) between the exposure masks M1 and M2 on the basis of the substrate.

In the above-described example, the line widths of the storage capacitor bus lines 18b and 18c (any of the distances L1 and L4) are measured to judge directly which of the line widths of the storage capacitor bus lines 18b and 18c are greater and to correct the relative position of the exposure masks M1 and M2. However, the invention is not limited to that approach. For example, the distance between the upper edge of the storage capacitor bus line 18b in the region α and a lower edge of a gate bus line 12 opposite to the same (the distance between the adjoining bus lines) may be measured and compared with a design value. This also makes it possible to obtain the direction and amount of a relative misalignment between the exposure masks M1 and M2 on the basis of the substrate and to correct the relative position of the exposure masks M1 and M2.

Thereafter, drain bus lines 14, TFTs 20 and pixel electrodes are formed on the glass substrate 10. A TFT substrate fabricated through the above-described steps is combined with an opposite substrate, and a liquid crystal is sealed between the substrates to complete a liquid crystal display.

Although the regions α and β in which line widths are measured are equivalent to two pixels in length in the horizontal direction of the figure in the present embodiment, the width of the regions α and β is not limited to the same. Although the number of the regions α and β provided is one (each of which is equivalent to one pixel), the number of the regions α and β is not limited to this. A system for measuring line widths can be simpler and the time required for locating a measuring position can be shorter, the greater the width and the number of the regions α and β in which the measurement is to be made. The present embodiment has been described with reference to the exposure mask M1 having the cutouts 50 and 51 and the protrusions 54 and 55 provided along the wiring patterns 34b and 34c for forming relatively wide storage capacitor bus lines 18b and 18c and the exposure mask M2 having the cutouts 52 and 53 and the protrusions 56 and 57, by way of example. However, they may be replaced by exposure masks having cutouts and protrusions provided along other writing patterns such as a wiring pattern 32 for forming a gate bus line 12. Further, exposure masks may be employed in which writing patterns similar to the regions α and β are provided outside a display area, for example.

Although the cutouts 50 and 51 and the protrusions 54 and 55 and the cutouts 52 and 53 and the protrusions 56 and 57 are separately provided on the respective exposure masks M1 and M2 in the present embodiment, the cutouts 50, 51, 52 and 53 and the protrusions 54, 55, 56 and 57 may be provided on a single exposure mask. In such a case, the cutouts 50 and 51 and the protrusions 54 and 55 are provided on the right side of the exposure mask, and the cutouts 52 and 53 and the protrusions 56 and 57 are provided on the left side of the exposure mask. For example, in the case of divided exposure performed in four divisions in the direction in which gate bus line 12 extends, the above-described exposure mask may be used only for exposing the two internal divided exposure regions except the regions on both ends, and advantages similar to those of the present embodiment can be thus achieved.

In the present embodiment, the direction and amount of a relative misalignment between exposure masks on the basis of the substrate can be obtained using exposure mask which are actually used for patterning rather than a special reticle for obtaining a correction value. Therefore, an accurate correction of alignment can be made for an exposure mask having an alignment error that is far away from an average value. Even for substrates whose wiring layer has been patterned with an exposure apparatus having reduced stability for some reason, the yield of manufacture can be improved by providing feedback of a correction when a layer above the same is patterned.

Figure 13:
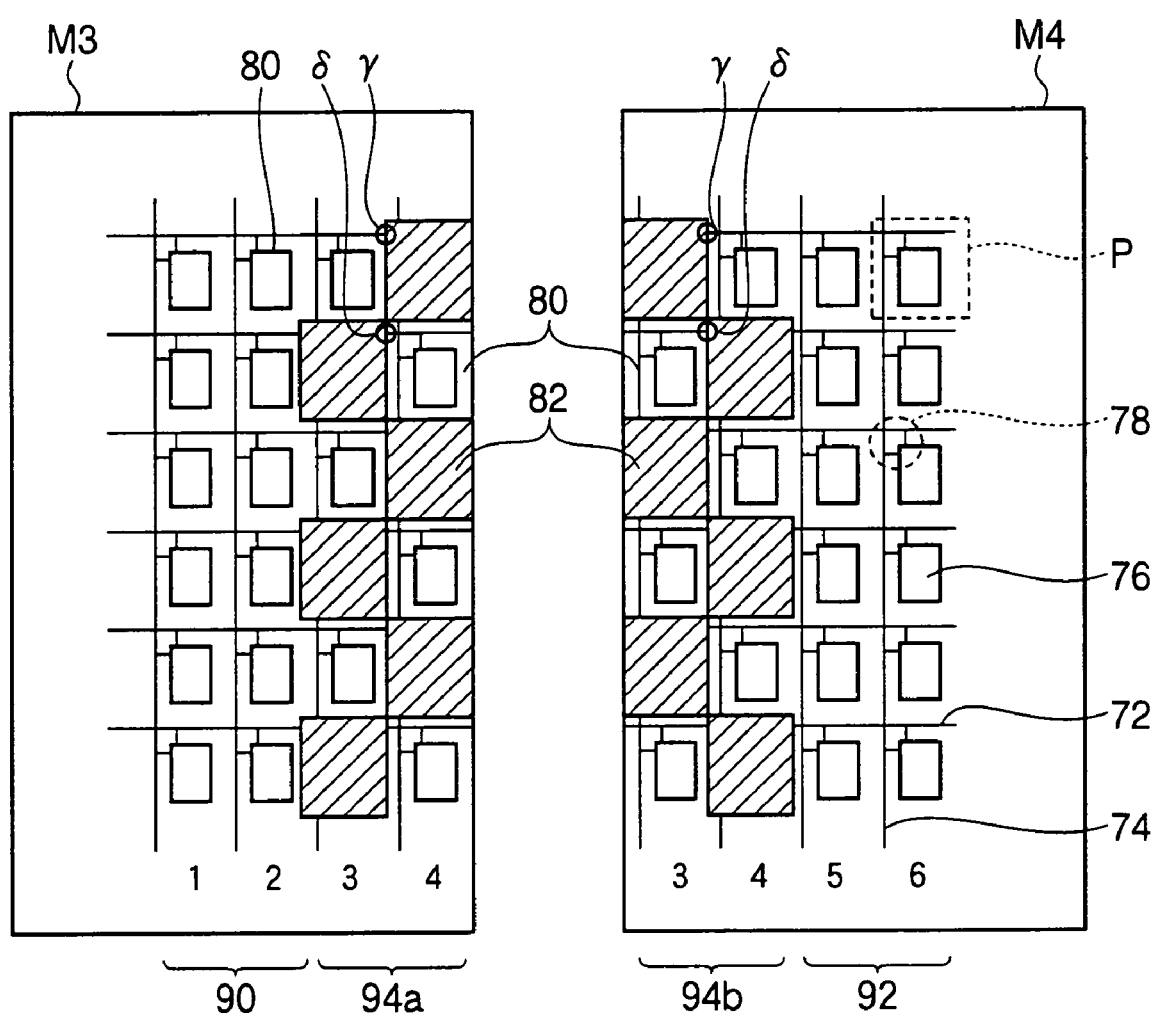
FIG. 13 schematically shows a modification of a configuration of exposure masks according to the embodiment of the invention.

A modification of the exposure masks of the present embodiment will now be described. FIG. 13 schematically shows a configuration of exposure masks in the present modification. Two exposure masks M3 and M4 are used for forming TFT substrates in six rows and six columns. In practice, there are exposure steps for a plurality of layers, and each of the layers is exposed in a different pattern. For simplicity of description, however, writing patterns 72 for forming gate bus lines 12, writing patterns 74 for forming drain bus lines 14, writing patterns 76 for forming pixel electrodes, and writing patterns for forming electrodes of TFTs 20 are illustrated to show basic pixel units P clearly.

TFT substrates in six columns formed on a substrate are divided into a first region (the first and second columns), a second region (the fifth and sixth columns) and a third region (the third and fourth columns). Pattern forming regions 80 for forming basic pixel units P are formed in a region 90 of an exposure mask M3 for forming the first region. Pattern forming regions 80 for forming basic pixel units P and shielding regions 82 for shielding basic pixel units as a whole from light are provided, for example, in a staggered configuration in a region 94a of the exposure mask M3 for forming the third region. On the contrary, pattern forming regions 80 for forming basic pixel units P are formed in a region 92 of an exposure mask M4 for forming the second region. Pattern forming regions 80 for forming basic pixel units P and shielding regions 82 for shielding basic pixel units as a whole from light are provided in a region 94a of the exposure mask M4 for forming the third region in a staggered configuration that is complementary to the region 94a of the exposure mask M3. In the third region in which patterns are formed by both of the exposure masks M3 and M4, each basic pixel unit P is patterned using either of the exposure masks M3 and M4.

Since the basic pixel units P in the third region near the boundary between the exposure masks M3 and M4 are thus formed using either of the exposure masks M3 and M4 randomly or regularly, any difference in luminance between the regions attributable to a relative misalignment between the exposure masks M3 and M4 is made less visually perceptible. In this modification, advantages similar to those in the above embodiment can be achieved by providing cutouts and protrusions in regions γ and δ where the writing patterns 72 extend out of the shielding regions 82 of the exposure masks M3 and M4.

The invention is not limited to the above embodiment and may be modified in various ways.

For example, while a positive type is used as the resist applied to the wiring layer in the above embodiment, the invention is not limited to the same, and a negative resist may be used instead. In this case, exposure masks are used in which the shielding regions formed with writing patterns in the exposure masks M1 and M2 of the above embodiment are replaced by transmmissive regions and in which the transmissive regions formed with no writing pattern in the above embodiment are replaced by shielding regions.

As described above, the invention makes it possible to provide a liquid crystal display which can achieve high display characteristics.

What is claimed is:

1. A pattern forming method for forming a resist pattern on a substrate having a plurality of divided exposure regions, the resist pattern extending across a first divided exposure region and a second divided exposure region among the plurality of divided exposure regions, the method comprising the steps of:

forming a resist film on the substrate;

exposing the resist film in the first divided exposure region to form a latent image which defines one edge of the resist pattern in the vicinity of a boundary between the first divided exposure region and the second divided exposure region, wherein the one edge is defined, in part, through the use of a first cutout portion, formed in a first mask, that extends in a first direction past a stitching portion and into the second divided exposure region;

exposing the resist film in the second divided exposure region to form a latent image which defines another edge of the resist pattern, opposite the one edge, in the vicinity of the boundary, wherein the other edge is defined, in part, through the use of a second cutout portion, formed in a second mask, that extends in a second direction past the stitching portion and into the first divided exposure region, where the second direction is opposite of the first direction; and developing the resist film to form the resist pattern.

2. A method of manufacturing a thin film transistor substrate, comprising the steps of forming a plurality of bus lines extending on a substrate with an insulation film interposed; and forming a plurality of thin film transistors connected to any of the plurality of bus lines, wherein the bus lines are formed using the pattern forming method according to claim 1.

3. A method of manufacturing a thin film transistor substrate according to claim 2, wherein the bus lines are storage capacitor bus lines.

4. A method of manufacturing a liquid crystal display comprising a liquid crystal sealed between two substrates, wherein at least either of the two substrates is fabricated using the method of manufacturing a thin film transistor substrate according to claim 3.

5. A method of manufacturing a liquid crystal display comprising a liquid crystal sealed between two substrates, wherein at least either of the two substrates is fabricated using the method of manufacturing a thin film transistor substrate according to claim 2.

6. A pattern forming method according to claim 1, wherein said first mask includes a first projection and said second mask includes a second projection, and further wherein during the step of exposing the resist film in the second divided exposure region, the second projection of the second mask is aligned to generally correspond with a previous position of the first cutout portion of the first mask and the second cutout portion of the second mask is aligned to generally correspond with a previous position of the first projection of the first mask.

7. A pattern forming method for forming a wiring pattern on a substrate having a plurality of divided exposure regions, the wiring pattern extending across a first divided exposure region and a second divided exposure region adjacent to each other among the plurality of divided exposure regions, the method comprising the steps of:

forming a wiring layer for forming the wiring pattern on the substrate;

forming a resist film on the wiring layer;

exposing the resist film in the first divided exposure region using a first exposure mask to form a latent image which defines one edge of the wiring pattern in the vicinity of a boundary between the first divided exposure region and the second divided exposure region;

exposing the resist film in the second divided exposure region using a second exposure mask to form a latent image which defines another edge of the wiring pattern in the vicinity of the boundary;

developing the resist film to form the resist pattern;

etching the wiring layer using the resist pattern as an etching mask to form the wiring pattern; and correcting a relative misalignment of the first and second exposure masks relative to the substrate based on a pattern width of the wiring pattern formed in the vicinity of the boundary.

8. A pattern forming method according to claim 7, wherein the correction is made by measuring the pattern width of the wiring pattern and calculating the direction and amount of a misalignment of the first and second exposure masks relative to the substrate.

9. A method of manufacturing a thin film transistor substrate, comprising the steps of forming a plurality of bus lines extending on a substrate with an insulation film interposed; and forming a plurality of thin film transistors connected to any of the plurality of bus lines, wherein the bus lines are formed using the pattern forming method according to claim 8.

10. A method of manufacturing a thin film transistor substrate according to claim 9, wherein the bus lines are storage capacitor bus lines.

11. A method of manufacturing a liquid crystal display comprising a liquid crystal sealed between two substrates, wherein at least either of the two substrates is fabricated using the method of manufacturing a thin film transistor substrate according to claim 10.

12. A method of manufacturing a liquid crystal display comprising a liquid crystal sealed between two substrates, wherein at least either of the two substrates is fabricated using the method of manufacturing a thin film transistor substrate according to claim 9.

13. A method of manufacturing a thin film transistor substrate, comprising the steps of forming a plurality of bus lines extending on a substrate with an insulation film interposed; and forming a plurality of thin film transistors connected to any of the plurality of bus lines, wherein the bus lines are formed using the pattern forming method according to claim 7.

14. A method of manufacturing a thin film transistor substrate according to claim 13, wherein the bus lines are storage capacitor bus lines.

15. A method of manufacturing a liquid crystal display comprising a liquid crystal sealed between two substrates, wherein at least either of the two substrates is fabricated using the method of manufacturing a thin film transistor substrate according to claim 14.

16. A method of manufacturing a liquid crystal display comprising a liquid crystal sealed between two substrates, wherein at least either of the two substrates is fabricated using the method of manufacturing a thin film transistor substrate according to claim 13.

* * * * *